US006309953B1

(12) United States Patent
Fischer et al.

(10) Patent No.: US 6,309,953 B1
(45) Date of Patent: Oct. 30, 2001

(54) PROCESS FOR PRODUCING A SEMICONDUCTOR DEVICE WITH A ROUGHENED SEMICONDUCTOR SURFACE

(75) Inventors: Helmut Fischer; Gisela Lang, both of Regensburg; Reinhard Sedlmeier, Neutraubling; Ernst Nirschl, Wenzenbach, all of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/517,299

(22) Filed: Mar. 2, 2000

Related U.S. Application Data

(62) Division of application No. 08/918,251, filed on Aug. 25, 1997, now Pat. No. 6,140,248, which is a continuation of application No. PCT/DE96/00137, filed on Jan. 31, 1996.

(30) Foreign Application Priority Data

Feb. 23, 1995 (DE) .............................................. 195 06 323

(51) Int. Cl.[7] ...................................................... H01L 21/28
(52) U.S. Cl. .............................. 438/606; 438/749; 438/33
(58) Field of Search .............................. 438/33, 606, 572, 438/464, 751; 257/13

(56) References Cited

U.S. PATENT DOCUMENTS

| 4,124,160 | 11/1978 | Tsukada et al. . |
| 4,188,710 | 2/1980 | Davey et al. . |
| 5,132,751 | 7/1992 | Shibata et al. . |
| 5,429,954 | * 7/1995 | Gerner .................................... 438/33 |
| 6,140,248 | * 10/2000 | Fischer et al. ......................... 438/749 |

FOREIGN PATENT DOCUMENTS

| 1058732 | 7/1979 | (CA) . |
| 27 19 657 | 12/1977 | (DE) . |
| 251 905 A3 | 12/1987 | (DE) . |
| 43 05 296 A1 | 8/1994 | (DE) . |
| 0 377 322 A1 | 7/1990 | (EP) . |
| 59-175776 | 3/1983 | (JP) . |
| 62--182200 | 2/1986 | (JP) . |

OTHER PUBLICATIONS

"Aluminum Layers as Nonalloyed Contacts to p–Type GaAs" (Ragay et al.), Applied Physics Letter 63, Aug. 1993, pp. 1234–1236.

"Improved Thinning of Gallium Arsenide Substrates by Wet Etching" (Block et al.), J. Electrochemical Society, vol. 137, No. 10, abstract only.

Patent Abstracts of Japan No. 63–249384 (Shiose), dated Oct. 17, 1988.

Fundamental Selective Etching Characteristics of HF + $H_2O_2$ + $H_2O$ Mixtures for GaAs (Takebe et al.), J. Electrochemical Society, vol. 140, No. 4, Apr. 1993, pp. 1169–1180.

(List continued on next page.)

*Primary Examiner*—Olik Chaudhuri
*Assistant Examiner*—Theresa Doan
(74) *Attorney, Agent, or Firm*—Herbert L. Lerner; Laurence A. Greenberg; Werner H. Stemer

(57) ABSTRACT

A process for producing a semiconductor device includes the following sequential steps: producing a semiconductor body having an $Al_xGa_{1-x}As$ layer with an upper surface, where $x \leq 0.40$; applying a contact metallization made of a non-noble metallic material to the $Al_xGa_{1-x}As$ layer; precleaning a semiconductor surface to produce a hydrophilic semiconductor surface; roughening the upper surface of the $Al_xGa_{1-x}As$ layer by etching with an etching mixture of hydrogen peroxide $\geq 30\%$ and hydrofluoric acid $\geq 40\%$ (1000:6) for a period of from 1 to 2.5 minutes; and re-etching with a dilute mineral acid. According to another embodiment, $0 \leq x \leq 1$ and the upper surface of the $Al_xGa_{1-x}As$ layer is roughened by etching with nitric acid 65% at temperatures of between 0° C. and 30° C.

4 Claims, 1 Drawing Sheet

OTHER PUBLICATIONS

Patent Abstracts of Japan No. 60–45648 (Hiroshi), dated Feb. 18, 1994.

Patent Abstracts of Japan No. 57–097686 (Kazuo), dated Jun. 17, 1982.

Hollemann–Wiberg: "Lehrbuch der Anorganischen Chemie" [manual for anorganic chemistry], de Gruyter, Berlin, 1976, pp. 645–647.

* cited by examiner

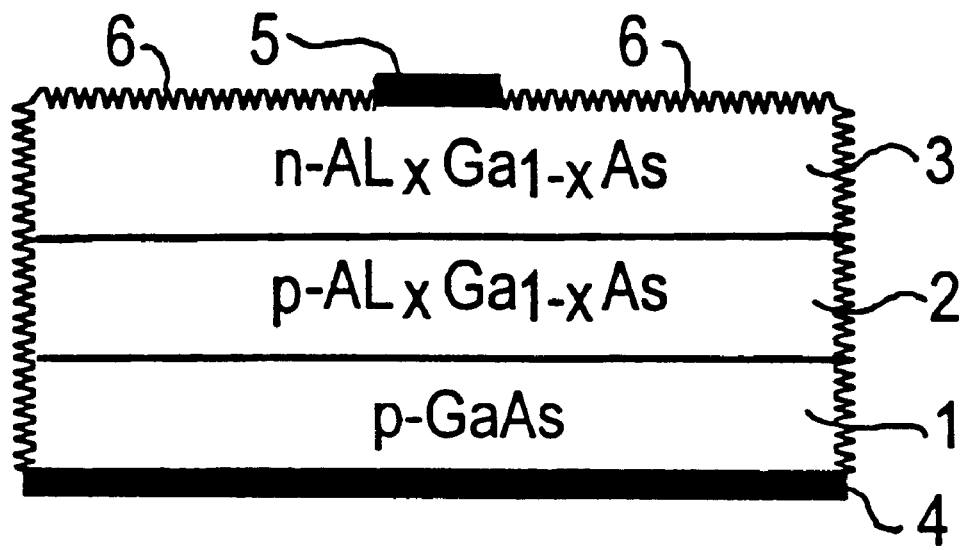

PROCESS FOR PRODUCING A SEMICONDUCTOR DEVICE WITH A ROUGHENED SEMICONDUCTOR SURFACE

CROSS-REFERENCE TO RELATED APPLICATION

This is a division of U.S. application Ser. No. 08/918,251, filed Aug. 25, 1997 now U.S. Pat. No. 6,140,248 which was a continuation of International Application No. PCT/DE96/00137, filed Jan. 31, 1996.

BACKGROUND OF THE INVENTION

FIELD OF THE INVENTION

The invention relates to a process for producing a semiconductor device with a roughened semiconductor surface.

Such a process is described, for example, in East German Patent DD 251 905 A3. That document discloses a process for producing a light-emitting semiconductor device having a III–V compound semiconductor body, in which the surface is roughened. Contact metallizations, which are formed of a gold-beryllium layer and a gold layer, are applied to subregions of the III–V compound semiconductor surface, for the purpose of making electrical contact.

A process is further known from German Published, Non-Prosecuted Patent Application DE 43 05 296 A1, corresponding to U.S. Pat. No. 5,429,954, in which the side surfaces of a mesa-etched LED semiconductor chip are roughened through the use of etching in order to improve output light coupling.

The roughening reduces the total reflection of the light radiation produced in the semiconductor device at the surface. As a consequence thereof, the radiated intensity, and therefore also the external quantum efficiency of the light-emitting semiconductor device, is increased.

However, the contact metallizations made of gold-beryllium and gold cause great difficulties in the production of those semiconductor devices.

Firstly, there are difficulties in automatic optical is detection of the gold metallizations. The reason therefor is an unfavorable contrast between the semiconductor surface and the gold contact surface. The camera systems conventionally used in chip assembly lines must be specially adjusted for that material combination. Without that adjustment, reasonably reliable automatic optical detection is not possible. However, any re-adjustment in chip assembly lines entails additional costs.

Great difficulties are also caused by the fact that the junction between the conventionally used gold bonding wire and a gold bonding pad only has low mechanical strength. That increases the risk of the connection wiring being torn off during the chip production, for example during encasing.

SUMMARY OF THE INVENTION

It is accordingly an object of the invention to provide a process for producing a semiconductor device with a roughened semiconductor surface, which overcomes the hereinafore-mentioned disadvantages of the heretofore-known methods of this general type.

With the foregoing and other objects in view there is provided, in accordance with the invention, a process for producing a semiconductor device, which comprises the following sequential steps: producing a semiconductor body having an $Al_xGa_{1-x}As$ layer with an upper surface, where $x \leq 0.40$; applying a contact metallization made of a non-noble metallic material to the $Al_xGa_{1-x}As$ layer; precleaning a semiconductor surface to produce a hydrophilic semiconductor surface; roughening the upper surface of the $Al_xGa_{1-x}As$ layer by etching with an etching mixture of hydrogen peroxide $\geq 30\%$ and hydrofluoric acid $\geq 40\%$ (1000:6) for a period of from 1 to 2.5 minutes; and re-etching with a dilute mineral acid.

With the objects of the invention in view there is also provided a process for producing a semiconductor device, which comprises the following sequential steps: producing a semiconductor body having an $Al_xGa_{1-x}As$ layer with an upper surface, where $0 \leq x \leq 1$; applying a contact metallization made of a non-noble metallic material to the $Al_xGa_{1-x}As$ layer; precleaning a semiconductor surface to produce a hydrophilic semiconductor surface; and roughening the upper surface of the $Al_xGa_{1-x}As$ layer by etching with nitric acid 65% at temperatures of between 0° C. and 30° C.

In accordance with another mode of the invention, there is provided a process which comprises forming the contact metallization of aluminum or an aluminum-based alloy.

In accordance with a concomitant mode of the invention, there is provided a process which comprises additionally roughening at least sub-regions of lateral surfaces of the semiconductor body.

A contact metallization made of a non-noble metallic material such as, for example, aluminum or an aluminum-based alloy generally has better contrast with the semiconductor material than the known gold metallization. It therefore ensures reliable automatic optical detection with conventionally used optical detection systems. The mechanical strength of the connection between the aluminum bonding pads and gold bonding wires is significantly higher than that of a gold-gold connection. The use of non-noble metallic materials such as, for example, aluminum has the additional advantage that production of the contact metallizations does not require any special cycles outside the conventionally used production lines.

Other features which are considered as characteristic for the invent ion are set forth in the appended claims.

Although the invention is illustrated and described herein as embodied in a process for producing a semiconductor device with a roughened semiconductor surface, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the a accompanying drawings.

BRIEF DESCRIPTION OF THE DRAWING

The FIGURE of the drawing is a fragmentary, diagrammatic, cross-sectional view of a semiconductor device produced by using the process according to the invention.

DESCRIPTION OF THE PREFERRED EMBODIMENTS

Referring now in detail to the single FIGURE of the drawing, there is seen a cross section through a light-emitting diode.

A p-conducting $Al_xGa_{1-x}As$ layer 2 is applied to a p-conducting GaAs substrate 1 and an n-conducting $Al_xGa_{1-}$ $_x$As layer 3 is in turn applied on top of the layer 2. The bottom of the conducting substrate 1 is covered surface-wide with a first contact metallization 4 made of a non-noble metallic material. A second contact metallization 5 is applied to the top of the n-conducting $Al_xGa_{1-x}As$ layer 3. The second contact metallization is made of a non-noble metallic material, but covers only a small part of the surface of the n-conducting $Al_xGa_{1-x}As$ layer 3. The contact metallizations 4, 5 are formed, for example, of aluminum or an aluminum-based alloy. Free surfaces of the GaAs substrate 1 and of the $Al_xGa_{1-x}As$ layers 2, 3 have a roughening 6.

The production of a semiconductor device of this type requires a process which on one hand roughens the surface of the semiconductor materials and on the other hand does not attack the surface of the contact metallizations 4, 5 in order to maintain bonding pad properties.

A process of this type for producing a semiconductor device with roughened GaAs and $Al_xGa_{1-x}As$ surfaces, with an Al content of $x \leq 0.40$ and contact metallizations having aluminum surfaces has, for example, the following sequential steps:

a) producing the semiconductor body;

b) applying the aluminum contact metallizations;

c) precleaning the semiconductor surface to produce a hydrophilic semiconductor surface, for example by washing with water, optionally with the addition of detergent;

d) roughening by etching with an etching mixture of hydrogen peroxide $\geq 30\%$ and hydrofluoric acid $\geq 40\%$ (1000:6) for a time of from 1 to 2.5 minutes; and e) re-etching with a dilute mineral acid such as, e.g., sulfuric acid 15%, at 35° C. for a time of from 1 to 2 minutes.

A process for producing a semiconductor device with roughened GaAs and $Al_xGa_{1-x}As$ surfaces, with an Al content of $0 \leq x \leq 1$ and contact metallizations having aluminum surfaces has, for example, the following sequential steps:

a) producing the semiconductor body;

b) applying the aluminum contact metallization;

c) precleaning the semiconductor surface to produce a hydrophilic semiconductor surface, for example by washing with water, optionally with the addition of detergent; and d) roughening by etching with nitric acid 65% at temperatures of between 0° C. and 30° C.

In order to provide the roughening by etching, the temperature and the etching time must be tailored according to the aluminum content x.

The known wafer production processes are used to produce the above-described semiconductor device. This means that no additional cost-increasing outlay to produce the semiconductor device with a roughened surface is needed. The roughening of the surface takes place as a last step at the end of the wafer production process, after division into chips on a carrier sheet. If, for example, the intention is to roughen only the top, or the top and sub-regions of the lateral surface, of the semiconductor body shown in the FIGURE, the roughening is carried out before the division into chips, or after sawing division lines between the chips. The already-fabricated structures remain unimpaired, so that no special processes are needed for treating, passivating and connecting the chips.

We claim:

1. A process for producing a semiconductor device, which comprises the following sequential steps:

a) producing a semiconductor body having an $Al_xGa_{1-x}As$ layer with an upper surface, where $0 \leq x \leq 1$;

b) applying a contact metallization made of a non-noble metallic material to the $Al_xGa_{1-x}As$ layer;

c) precleaning a semiconductor surface to produce a hydrophilic semiconductor surface; and d) roughening the upper surface of the $Al_xGa_{1-x}As$ layer by etching with nitric acid 65% at temperatures of between 0° C. and 30° C.

2. The process according to claim 1, which comprises forming the contact metallization of aluminum.

3. The process according to claim 1, which comprises forming the contact metallization of an aluminum-based alloy.

4. The process according to claim 1, which comprises additionally roughening at least sub-regions of lateral surfaces of the semiconductor body.

* * * * *